United States Patent [19]
Yamaha

[11] Patent Number: 5,733,797
[45] Date of Patent: Mar. 31, 1998

[54] METHOD OF MAKING A SEMICONDUCTOR DEVICE WITH MOISTURE IMPERVIOUS FILM

[75] Inventor: Takahisa Yamaha, Hamamatsu, Japan

[73] Assignee: Yamaha Corporation, Japan

[21] Appl. No.: 166,548

[22] Filed: Dec. 14, 1993

[30] Foreign Application Priority Data

Dec. 16, 1992 [JP] Japan .................... 4-354402

[51] Int. Cl.⁶ .................................................. H01L 21/44
[52] U.S. Cl. ........................... 437/195; 437/231; 437/978
[58] Field of Search .................................. 437/195, 978, 437/231

[56] References Cited

U.S. PATENT DOCUMENTS

| | | | |
|---|---|---|---|
| 4,668,973 | 5/1987 | Dawson et al. | 357/54 |
| 4,885,262 | 12/1989 | Ting et al. | 437/231 |
| 4,894,351 | 1/1990 | Batty | 437/190 |
| 4,986,878 | 1/1991 | Malazgirt et al. | 156/643 |
| 4,997,790 | 3/1991 | Woo et al. | 437/195 |
| 5,003,062 | 3/1991 | Yen | 437/231 |
| 5,215,933 | 6/1993 | Araki | 437/43 |
| 5,231,054 | 7/1993 | Kosugi | 437/192 |
| 5,252,515 | 10/1993 | Tsai et al. | 437/195 |
| 5,254,497 | 10/1993 | Liu et al. | 437/173 |
| 5,262,352 | 11/1993 | Woo et al. | 437/189 |
| 5,275,972 | 1/1994 | Ogawa et al. | 437/195 |
| 5,283,202 | 2/1994 | Pike, Jr. et al. | 437/31 |
| 5,284,801 | 2/1994 | Page et al. | 437/195 |
| 5,316,975 | 5/1994 | Maeda | 437/195 |
| 5,324,690 | 6/1994 | Gelatos et al. | 437/236 |
| 5,328,553 | 7/1994 | Poon | 437/195 |
| 5,334,552 | 8/1994 | Homma | 437/195 |
| 5,334,554 | 8/1994 | Lin et al. | 437/195 |
| 5,352,630 | 10/1994 | Kim et al. | 437/195 |
| 5,364,818 | 11/1994 | Ouellet | 437/195 |
| 5,376,590 | 12/1994 | Machida et al. | 437/235 |
| 5,406,104 | 4/1995 | Hirota et al. | 257/351 |

(List continued on next page.)

FOREIGN PATENT DOCUMENTS 5-55199  3/1993  Japan.

OTHER PUBLICATIONS

Wolf et al., "Silicon Processing for the VLSI Era", vol. II, 1990, Lattice Press, p. 273–276.

K. Tatsuuma, et al., Technical Research Report of the Institute of Electronics, Information and Communication Engineers, Silicon Devices and Materials, *Hot Carrier Effects*, SDM-90-123 (Nov. 20, 1993).

1993 Proceedings Tenth International VLSI Multilevel Interconnection Conference (VMIC); "Field Inversion in CMOS Double Metal Circuits Induced by Water from Outside"; Takahisa Yamaha, Yushi Inoue, Osamu Hanagasaki and Takahiko Hotta; VMIC Catalog No. 93ISMIC–102.

1994 Proceedings Eleventh International VLSI Multilevel Interconnection Conference (VMIC); "Moisture–Blocking Mechanism of ECR–Plasma SiO2 and High Reliable Performance of Multilevel Al Metalization"; M. Doki, H. Watatani, S. Okuda and Y. Furumura; VMIC Catalog No. 94ISMIC–103.

*Primary Examiner*—Charles L. Bowers, Jr.
*Assistant Examiner*—Lynne A. Gurley

[57] ABSTRACT

A moisture impervious film 24 such as silicon nitride is formed under an interlayer insulating film, covering the active region of an IC chip. The interlayer insulating film is formed, for example, by lamination of a silicon oxide film, a spin-on-glass (SOG) film, and another silicon oxide film. Moisture ($H_2O$) is intercepted by the moisture impervious film and does not reach the active region. It is possible to avoid the conductivity type inversion at the surface of a p-type well region in the active region and to suppress the corrosion of wiring layers, improving the reliability of the IC chip. The moisture impervious film is not limited to be formed at the layer under the silicon oxide film, but it is sufficient only if the film is formed at the layer under the SOG film.

12 Claims, 3 Drawing Sheets

U.S. PATENT DOCUMENTS

| | | | |
|---|---|---|---|
| 5,424,570 | 6/1995 | Sardella et al. | 257/333 |
| 5,459,105 | 10/1995 | Matsuura | 437/195 |
| 5,461,254 | 10/1995 | Tsai et al. | 257/646 |
| 5,472,913 | 12/1995 | Havemann et al. | 437/195 |
| 5,476,817 | 12/1995 | Numata | 437/195 |
| 5,506,177 | 4/1996 | Kishimoto et al. | 437/195 |
| 5,512,513 | 4/1996 | Machida et al. | 437/195 |
| 5,556,806 | 9/1996 | Pan et al. | 437/195 |

METHOD OF MAKING A SEMICONDUCTOR DEVICE WITH MOISTURE IMPERVIOUS FILM

BACKGROUND OF THE INVENTION a) Field of the Invention

The present invention relates to a semiconductor device with an integrated circuit (IC) chip, and more particularly to a semiconductor integrated circuit device capable of preventing moisture in a spin-coated insulating layer constituting an interlayer insulating film from permeating into an active region.

b) Description of the Related Art

As a protective structure for IC chips, there is known a seal ring structure such as shown in FIGS. 2 and 3. FIG. 2 is a cross section, and FIG. 3 is a plan view.

In FIGS.2 and 3, a plurality of inner chip regions 30A, 30B are formed on the surface of a semiconductor substrate 10. Each inner chip region includes ICs formed by a number of circuit elements and wirings. The peripheral region of the inner chip region is formed with a seal ring structure such as shown in FIG. 2 for preventing the invasion of moisture and impurities from the external environment.

The seal ring structure is formed surrounding each inner chip region 30A, 30B and covering the edge portion of a field insulating film 12 formed on the substrate surface. The seal ring is formed by a first interlayer insulating film 14, a first wiring layer 16, a second interlayer insulating film 18, a second wiring layer 20, and a protective insulating film 22 sequentially in this order from the bottom. The wiring layers 16 and 20 are formed when forming first and second wiring layers in the internal chip regions, but are electrically separated from the latter. A silicon nitride film formed by a plasma CVD (Chemical Vapor Deposition) is often used as the protective insulating film 22.

The substrate 10 in the form of a wafer formed with internal chip regions 30A, 30B and their peripheral seal ring structures, is diced along crossing scribe regions 32A and 32B shown in FIG. 3 and divided into separate IC chips.

With this conventional technique, however, as shown in FIG. 3, a scratch X reaching the internal chip region 30A may sometimes be formed when dicing the substrate. FIG. 4 shows an IC chip 30 having the insulating films 12, 14, and 18 exposed at the chip side wall 30E because of the scratch X. In FIG. 3, like elements to those shown in FIG. 2 are represented by identical reference numerals.

Referring to FIG. 4, on the surface of an n-type semiconductor substrate 10, there is formed a p-type well region 10W. On the surface of the well region 10W, MOS transistors Ta, Tb of an LDD (Lightly Doped Drain) type are formed in a tub region surrounded by the field insulating film 12. A region 30a in which IC circuit elements such as transistors Ta, Tb are formed, is called an active region.

The first interlayer insulating film 14 is disposed between the gate electrode layers 13G of transistors Ta and Tb and the first wiring layers 16S and 16D on the source/drain regions, and made of, for example, BPSG (boron phospho silicate glass). The wiring layers 16S and 16D are used as the source and drain wirings, respectively.

The second interlayer insulating film 18 is disposed between the first wiring layers 16S and 16D and the second wiring layers 20D. For example, this film 18 has a laminated structure of a silicon oxide film 18a, a generally flat spin-on-glass (SOG) film 18b formed on the film 18a by spin-coating SOG, and another silicon oxide film 18c formed on the SOG film. The wiring layer 20D is electrically connected to the wiring layer 16D via a contact hole 18P formed in the insulating film 18, and used as the drain wiring.

If the SOG film 18b exposes at the chip side wall, moisture may sometimes permeate into the SOG film when severing the wafer. Permeated moisture diffuses from the SOG film 18b downward to the underlie field insulating film 12, causing a malfunction of transistors Ta, Tb.

In order to eliminate such defects, it is possible to make the scratch not reach the seal ring structure by widening the width of the scribe regions 32A, 32B, generally of about 100 µm. However, this approach is not practical because the number of chips per one wafer is reduced.

SUMMARY OF THE INVENTION

It is an object of the present invention to provide a novel semiconductor device capable of preventing moisture at a scratch from permeating into the active region, without widening the width of a scribe region.

According to one aspect of the present invention, there is provided a semiconductor device having a semiconductor substrate, a plurality of circuit elements formed on the surface of the semiconductor substrate at predetermined active regions, a laminated wiring layer having a plurality of wiring layers and a plurality of interlayer insulating films respectively formed on the surface of the substrate, the circuit elements and the plurality of wiring layers and interlayer insulating films constituting an integrated circuit, one of the interlayer insulating films being formed by a generally flat spin-coated insulating film covering the active region and reaching the side wall of the substrate or near the side wall, and a protective insulating film covering the laminated wiring layer, wherein a moisture impervious film is formed at the layer lower than the spin-coated insulating film, the moisture impervious film covering the active region.

The moisture impervious film is formed at the layer lower than the spin-coated insulating film such as an SOG film constituting the interlayer insulating film, to prevent moisture from being permeating into the active region. Accordingly, even if the spin-coated insulating film such as an SOG film exposes at the chip side wall because of a scratch formed when dicing, moisture permeating from the exposed area of the spin-coated insulating film is intercepted by the moisture impervious film and does not reach the active region. It is also possible to prevent the conductivity type inversion and wiring corrosion within a chip, realizing a high reliability IC device.

It is also unnecessary to widen the width of the scribe region, avoiding a reduction in the number of chips per wafer.

DETAILED DESCRIPTION OF THE PREFERRED EMBODIMENTS

Figure 1:
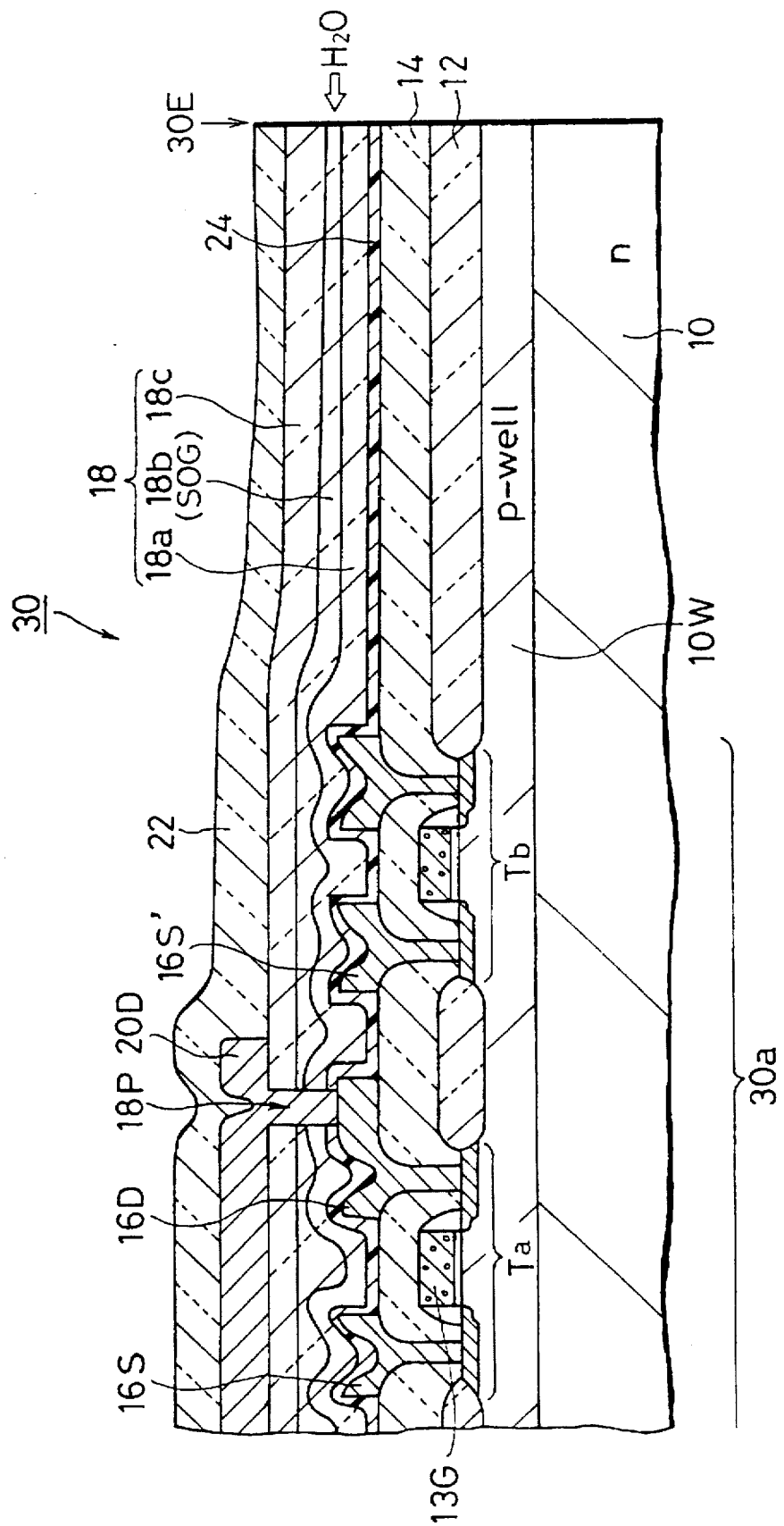
FIG. 1 is a cross section of the substrate of an IC chip according to an embodiment of the present invention.

FIG. 1 shows an IC chip according to an embodiment of the invention, wherein like elements to those shown in FIG.

4 are represented by identical reference numerals and the description thereof is omitted.

An IC chip 30 includes an n-type semiconductor substrate 10, a p-type well region 10W, a field insulating film 12, and the like. In an active region 30a, there are formed circuit elements such as MOS transistors Ta, Tb of an LDD structure.

PSG and BPSG are deposited in this order on the upper surface of the substrate to the thicknesses of 100 nm and 600 nm, respectively. Thereafter, BPSG is heated to 1000° C. to flow it and form a first interlayer insulating film. After necessary contact holes are formed in the first interlayer insulating film 14, WSi, Al alloy (e.g., Al—Si—Cu), and WSi, are coated in this order on the upper surface of the substrate by means of sputtering or the like. The coated layer is patterned to form first wiring layers 16S, 16D, and 16S'. The wiring layers 16S and 16D are used as the source and drain wirings for the transistor Ta, and the wiring layer 16S' is used as the source wiring of the transistor Tb.

Next, silicon nitride is deposited on the upper surface of the substrate to the thickness of 100 nm by a plasma CVD to form a moisture impervious film 24. This film 24 may be made of a silicon nitride film formed by sputtering.

In the present specification, a moisture impervious film is defined as a film protecting a downward moisture diffusion to the underlayered transistors and to the field oxide film and any material which falls within this definition may function as a moisture impervious film. As a result of prevention of the downward moisture diffusion, it suppresses malfunction of isolation function of the field oxide film.

Next, a second interlayer insulating film 18 is formed on the upper surface of the substrate. Specifically, a silicon oxide film 18a is formed to the thickness of 400 nm by a plasma CVD, a spin-on-glass (SOG) film 18b is spin-coated to the thickness of about 300 nm and cured at a temperature of 400° C., and thereafter, another silicon oxide film 18c is formed to the thickness of 400 nm by a plasma CVD.

Next, by using a photoresist film as a mask, a contact hole 18P is formed in the interlayer insulating film 18 and moisture impervious film 24 to the surface of the wiring layer 16D.

Next, Al alloy (e.g., Al—Si—Cu) is deposited on the upper surface of the substrate by sputtering technique. The Al-alloy layer is patterned to form a wiring layer 20D.

Figure 2:
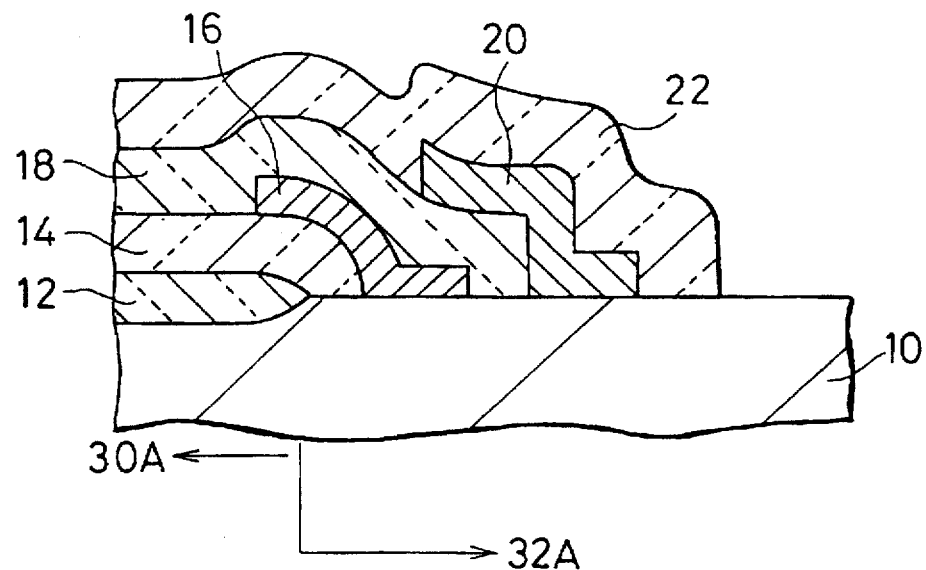
FIG. 2 is a cross section showing a conventional IC chip protective structure.

Thereafter, silicon nitride is deposited on the upper surface of the substrate to form a passivation film 22. At the peripheral area of each internal chip region, the seal ring structure and its manufacturing processes such as explained with FIG. 2 are used. In this case, wiring layers 16 and 20 are formed by the same processes as for the wiring layers 16S and 16D.

The finished substrate in the form of a wafer is diced along the scribe regions such as shown in FIG. 8 to form separated IC chips 30.

If the SOG film 18b exposes at the chip side wall 30E, moisture (H2O) may sometimes permeate externally from the SOG film 18b to the inside of the chip if the moisture impervious film 24 were not provided. A probability of moisture permeation becomes very great, particularly when using organic SOG. Permeated moisture diffuses rapidly in the SOG film 18b downward to the active region 30a. Moisture (hydrogen atoms) diffused in the SOG film 18b gradually diffuses downward, generating positive fixed electric charges in the field insulating film 12. As a result, negative electric charges are induced in the p-type well region 10W to invert the conductivity type to an n-type. Therefore, a leakage current IL flows, for example, through the transistors Ta and Tb, hindering the normal operation of the transistors.

Figure 3:
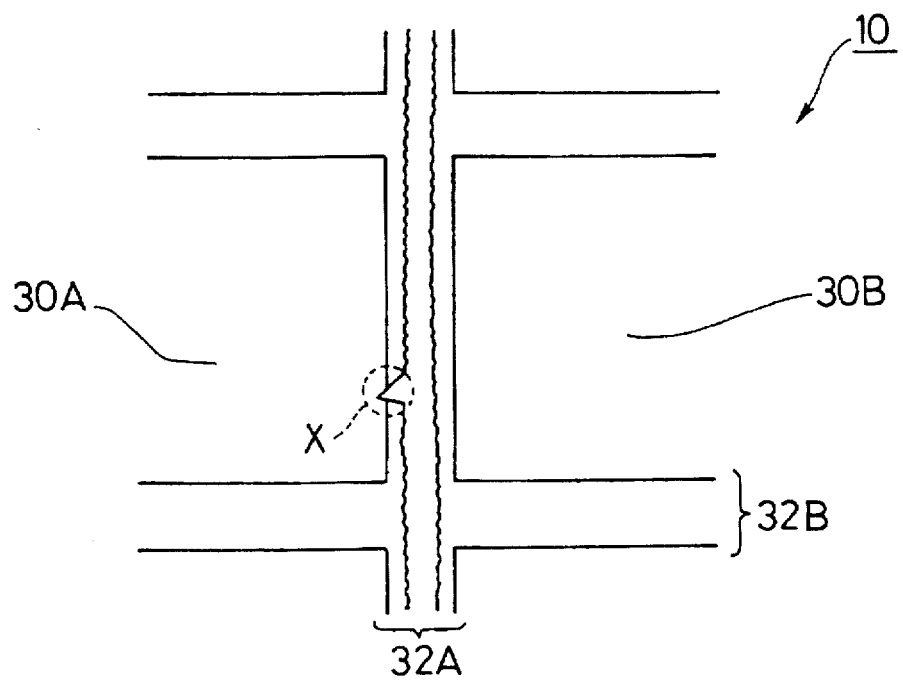
FIG. 3 is a plan view showing the layout of active regions on the surface of a substrate.

However, with the provision of the moisture impervious film 24, even if a scratch X such as shown in FIG. 3 is formed when dicing and the interlayer insulation film 18 exposes at the side wall 30E of the chip, moisture ($H_2O$) externally permeated into the SOG film 18b can be intercepted by the moisture impervious film 24, preventing the moisture from reaching the active region 30a. Accordingly, no conductivity type inversion will occur at the surface of the well region 10W, and no leakage current will flow.

The patterned electrodes 18 such as aluminum electrodes have sharp edges, and cracks may be formed on the CVD $SiO_2$ film 18a over such sharp edges. Also in this case, moisture permeated in the SOG film 18b can be intercepted by the overlying nitride film 24. In order to protect the AL electrodes from corrosion caused by permeated moisture, it is preferable to form the nitride film directly on the AL electrodes.

Figure 4:
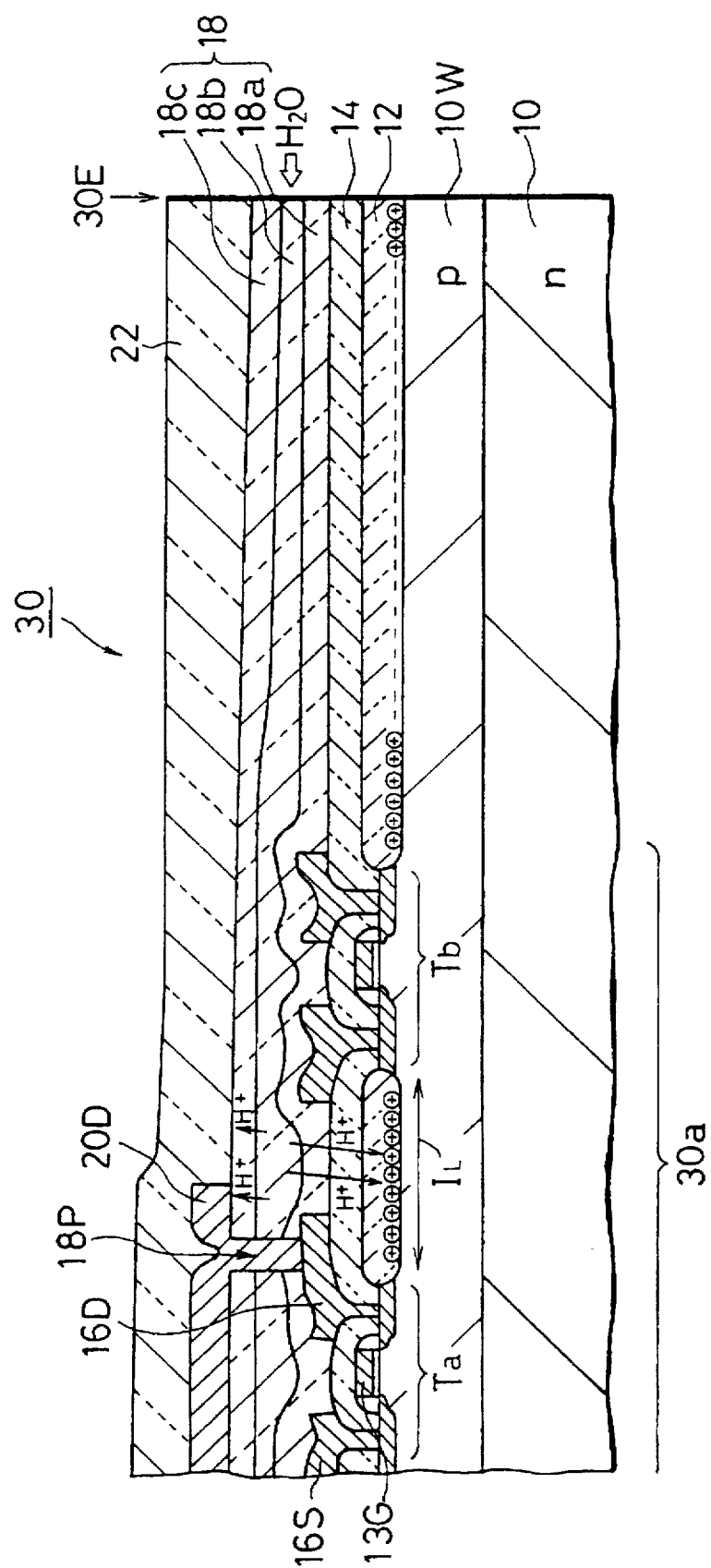
FIG. 4 is a cross section of the substrate of a conventional IC chip, explaining a conductivity type inversion phenomenon.

A leakage current between the wiring layers 20D and 16S' was measured by applying 0 V to the well region 10W and wiring layer 16S' and 0.2 V to the wiring layer 20D. 100 samples of the embodiment shown in FIG. 1 and 100 samples of the conventional structure shown in FIG. 4 were prepared. The samples were placed for 100 hours in a test chamber (140° C., 85% RH) of a pressure cooker test instrument. The leakage currents were measured before and after the 100-H exposure, and the results shown in Table 1 were obtained.

TABLE 1

|  | Embodiment Samples | Conventional Samples |
| --- | --- | --- |
| Before Exposure | ≦0.1 pA | ≦0.1 pA |
| After Exposure | ≦0.1 pA | 100 pA to 10 nA |

As seen from the test results shown in Table 1, the present invention presents a great effect of suppressing a leakage current.

Moisture is prevented from permeating into the wiring layers 16S, 16D, and 16S' in the structure shown in FIG. 1, suppressing the wiring corrosion. Another moisture impervious film like the film 24 may be formed at the layer lower than the second wiring layer 20D and higher than the SOG film 18b, in order to suppress the corrosion of the wiring layer 20D.

In the above embodiment, although the moisture impervious film 24 has been formed under the interlayer insulating film 18, the position of the layer 24 is not limited to it so long as it is formed at the layer lower than the SOG film 18b and higher than the electrode layer 13G. For example, the moisture impervious layer 24 may be formed at the layer lower or higher than the first interlayer insulating film 14, or may be formed in the film 14. In the case of the moisture impervious film 24 over the insulating film 14, if a sputtered silicon nitride film which has rarely a film stress is used as the moisture impervious film 24, the hot carrier resistance can be prevented from being lowered by a film stress.

I claim:

1. A method for manufacturing a semiconductor device comprising the steps of:

(a) providing a semiconductor substrate;

(b) forming an underlayer structure on the semiconductor substrate, the underlayer structure having an upper surface, a first transistor, a second transistor, and an isolation region therebetween for isolating the first and second transistors;

(c) forming a first interlayer insulating layer provided with a first connection hole on the upper surface of the underlayer structure;

(d) forming a first level wiring on the first interlayer insulating layer covering said first connection hole;

(e) forming a moisture impervious film directly on the first level wiring to cover the whole upper surface of the underlayer structure, the moisture impervious film protecting moisture diffusion from an upper layer down to the underlayer structure which moisture might cause malfunction of the isolation region; and (f) forming a second interlayer insulating film over the whole moisture impervious film, the second interlayer insulating film having an affinity for moisture, which causes downward moisture diffusion toward the underlayer structure, said second layer insulating film being formed by forming a first oxide film over the moisture impervious film in a plasma ambient, forming a spin-on-glass (SOG) film over the first oxide film, and forming a second oxide film over the SOG film, the second interlayer insulating film being retained on the entire moisture impervious film.

2. A method according to claim 1 further comprising the step of:

forming a contact hole through the second interlayer insulating film and the moisture impervious film for contacting the first level wiring.

3. A method according to claim 1 wherein the moisture impervious film comprises silicon nitride.

4. A method according to claim 1 wherein the thicknesses of the first and second oxide films are about 400 nm, and the thickness of the spin-on-glass film is about 300 nm.

5. A method according to claim 1 wherein the spin-on-glass film is an organic spin-on-glass film.

6. A method according to claim 1, wherein the first insulating layer is provided with a second connection hole and the first level wiring covers said second connection hole and wherein said first level wiring contacts said first and second transistors through said first and second connection holes, respectively.

7. A method for manufacturing a semiconductor device comprising the steps of:

(a) providing a semiconductor substrate;

(b) forming an underlayer structure on the semiconductor substrate the underlayer structure having a first semiconductor element, a second semiconductor element, and an isolation region provided therebetween for isolating the first and second semiconductor elements;

(c) forming a first interlayer insulating layer provided with a connection hole;

(d) forming a first level wiring on the first interlayer insulating layer covering said connection hole;

(e) forming a laminated insulating layer directly on the first level wiring and the first interlayer insulating layer to cover the underlayer structure, comprising the steps of:

(e-1) forming a moisture impervious film directly on the first level wiring and the first interlayer insulating layer to cover the entire underlayer structure; and (e-2) forming a second interlayer insulating film on the entire moisture impervious film, said second layer insulating film being formed by forming a first oxide film over the moisture impervious film in a plasma ambient, forming a spin-on-glass (SOG) film over the first oxide film, and forming a second oxide film over the SOG film, the second interlayer insulating film being retained on the entire moisture impervious film; and (f) forming a hole through the laminated insulating layer to allow electrical contact to the first semiconductor element on the semiconductor substrate.

8. A method according to claim 7, wherein the moisture impervious film comprises silicon nitride.

9. A method according to claim 7, wherein step (e-2) comprises the steps of:

(e-2-1) forming a first oxide film over the moisture impervious film;

(e-2-2) forming a spin-on-glass film over the first oxide film; and (e-2-3) forming a second oxide film over the spin-on-glass film.

10. A method according to claim 9, wherein the thickness of the first and second oxide films are about 400 nm, and the thickness of the spin-on-glass film is about 300 nm.

11. A method according to claim 9, wherein the spin-on-glass film comprises organic spin-on-glass material.

12. A method for manufacturing a semiconductor device comprising the steps of:

(a) providing a semiconductor substrate;

(b) forming an underlayer structure having a metal layer with an upper surface on the semiconductor substrate;

(c) forming a moisture impervious film directly on the upper surface of the metal layer to cover the whole upper surface of the metal layer, the moisture impervious film protecting the covered metal layer from being subjected to moisture diffusion from upward; and (d) forming an interlayer insulating film on the entire moisture impervious level, said second layer insulating film being formed by forming a first oxide film over the moisture impervious film in a plasma ambient, forming a spin-on-glass (SOG) film over the first oxide film, and forming a second oxide film over the SOG film, the second interlayer insulating film being retained on the entire moisture impervious film.

* * * * *